(12) United States Patent
Varadarajan et al.

(10) Patent No.: US 7,041,543 B1
(45) Date of Patent: May 9, 2006

(54) STRAINED TRANSISTOR ARCHITECTURE AND METHOD

(75) Inventors: Bhadri Varadarajan, Beaverton, OR (US); William W. Crew, Portland, OR (US); James S. Sims, Tigard, OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/923,259

(22) Filed: Aug. 20, 2004

(51) Int. Cl.
*H01I 21/336* (2006.01)
*H01L 21/8234* (2006.01)

(52) U.S. Cl. .................. 438/197; 438/475; 438/630

(58) Field of Classification Search ............... 438/197, 438/513, 630, 633, 660, 721, 755, 651, 855, 438/680, 681, 475
See application file for complete search history.

(56) References Cited

U.S. PATENT DOCUMENTS

| | | | |
|---|---|---|---|
| 6,147,014 A * | 11/2000 | Lyding et al. | 438/798 |
| 6,444,533 B1 * | 9/2002 | Lyding et al. | 438/308 |
| 6,888,204 B1 * | 5/2005 | Lyding et al. | 257/405 |
| 2005/0170104 A1 * | 8/2005 | Jung et al. | 427/569 |

OTHER PUBLICATIONS

Peter Singer, "New Materials and Designs to Improve Transistor Performance", Apr. 1, 2004, Semiconductor International.
Ghani et al, "A 90nm High Volume Manufacturing Logic Technology Featuring Novel 45nm Gate Length Strained Silicon CMOS Transistors", IEEE, © 2003.
Bhadri N. Varadarajan, "Tensile Silicon Nitride—P1264 NESL", C & F Study, Aug. 21, 2003.

* cited by examiner

*Primary Examiner*—David Nhu
(74) *Attorney, Agent, or Firm*—Beyer, Weaver & Thomas LLP.

(57) ABSTRACT

Transistor architectures and fabrication processes generate channel strain without adversely impacting the efficiency of the transistor fabrication process while preserving the material quality and enhancing the performance of the resulting transistor. Transistor strain is generated is NMOS devices using a highly tensile post-salicide silicon nitride capping layer on the source and drain regions. The stress from this capping layer is uniaxially transferred to the NMOS channel through the source-drain regions to create tensile strain in NMOS channel.

17 Claims, 5 Drawing Sheets

STRAINED TRANSISTOR ARCHITECTURE AND METHOD

FIELD OF THE INVENTION

This invention relates to electronic devices and associated fabrication processes. More specifically, the invention relates to a strained transistor architecture for NMOS devices in which a highly tensile silicon nitride capping layer is provided on the source and drain regions to induce tensile strain in the NMOS channel region.

BACKGROUND OF THE INVENTION

As transistors are scaled to smaller dimensions there is a need for higher switching speeds. One solution to increase transistor speed is to strain the silicon in the channel. Adding a small amount of strain to the silicon lattice structure promotes higher electron and hole mobilities, which increase transistor drain current and device performance.

When the lattice is under tensile strain, its physical symmetry is broken, and with it the electronic symmetry. The lowest energy level of the conduction band is split, with two of the six original states dropping to a lower energy level and four rising to a higher energy level. This renders it more difficult for the electrons to be 'scattered' between the lowest energy states by a phonon, because there are only two states to occupy. Whenever electrons scatter, it randomizes their motion. Reducing scatter increases the average distance an electron can travel before it is knocked off course, increasing its average velocity in the conduction direction. Also, distorting the lattice through tensile strain can distort the electron-lattice interaction in a way that reduces the electron's effective mass, a measure of how much it will accelerate in a given field. As a result, electron transport properties like mobility and velocity are improved and channel drive current for a given device design is increased in a strained silicon channel, leading to improved transistor performance.

NMOS devices exercise a highly tensile silicon nitride capping layer to induce tensile strain in the NMOS channel region. The stress from this capping layer is uniaxially transferred to the NMOS channel through the source-drain regions to create tensile strain in NMOS channel. This highly tensile silicon nitride capping layer is generally deposited using a thermal CVD process. But advanced transistor architectures require lower thermal budgets, and hence thermal CVD processes cannot be used to deposit this tensile film.

Accordingly, new transistor architectures and fabrication processes for generating channel strain are needed.

SUMMARY OF THE INVENTION

The present invention addresses this need by providing transistor architectures and fabrication processes for generating channel strain without adversely impacting the efficiency of the transistor fabrication process while preserving the material quality and enhancing the performance of the resulting transistor. Transistor strain is generated in NMOS devices using a highly tensile post-salicide silicon nitride (SiN) capping layer on the source and drain regions, which is deposited using a PECVD process at a temperature of no more than 425° C. The stress from this capping layer is uniaxially transferred to the NMOS channel through the source-drain regions to create tensile strain in NMOS channel.

In one aspect, the invention relates to a method of fabricating a strained transistor structure. The method involves providing a NMOS transistor structure, the NMOS transistor structure having a substrate, a conductive gate separated from the substrate by a gate dielectric, source and drain regions in the substrate on either side of the gate, and a channel region underlying the gate. A layer of salicide is formed on the source and drain regions. A highly tensile SiN capping layer is then formed on the salicide overlying the source and drain regions. The SiN capping layer is formed by depositing a SiN layer on the salicide of the source and drain regions, and treating the capping layer in a nitrogen-containing plasma at a temperature of no more than 425° C. Hydrogen is removed from the capping layer thereby inducing tensile stress in the capping layer that is transferred to the NMOS channel through the source and drain regions resulting in a strained channel.

The deposition and treatment processes are preferably conducted using a PECVD process in which the SiN capping layer is deposited in a series of thin (e.g., 30 Å) film layers that are subjected to the post-deposition plasma anneal treatment for about 20s, for example. The deposition and anneal treatments are repeated until the total film thickness is achieved. Accordingly, up to 40 or more depositions and plasma treatments may be used for a total film thickness of, for example, 1250 Å. Of course, fewer depositions and plasma treatments may be used for thinner films, e.g., 10 30 Å depositions/treatments for a 300 Å film or 25 30 Å depositions/treatments for a 700 Å film.

The post-deposition plasma anneal treatment may use the same conditions as the deposition, but with the $SiH_4$ or other silicon precursor flow shut off, thus providing a $N_2+NH_3$ only plasma. This considerably reduces the processing time compared to cases where the plasma conditions need to be set again. Alternatively, different post-deposition plasma anneal conditions may be set separately.

In a more general sense, in one aspect the invention involves a method of fabricating a highly tensile SiN layer on a heat sensitive substrate, involving providing a heat sensitive substrate having a silicide surface layer, depositing a SiN capping layer on the silicide layer, and treating the capping layer in a nitrogen-containing plasma at a temperature of no more than 425° C. to remove hydrogen from the capping layer thereby inducing tensile stress in the capping layer.

In another aspect, the invention relates to a strained channel transistor architecture. The transistor has a NMOS transistor structure composed of a substrate, a conductive gate separated from the substrate by a gate dielectric, source and drain regions in the substrate on either side of the gate, and a channel region underlying the gate. The source and drain regions are covered with a layer of salicide, and the salicide is covered with a SiN capping layer. The channel region is strained by tensile stress in the capping layer transferred to the channel region via the source and drain regions, and the salicide resistivity is substantially as on formation. The SiN capping layer is formed on the salicide by a technique that does not require a temperature of greater than 425° C. such that the salicide is not thermally degraded by the application of the capping layer. As a result, the resistivity of the salicide in the final transistor remains substantially as on deposition.

These and other aspects and advantages of the invention are described further below and with reference to the drawings.

DETAILED DESCRIPTION OF THE INVENTION

Figure 1:
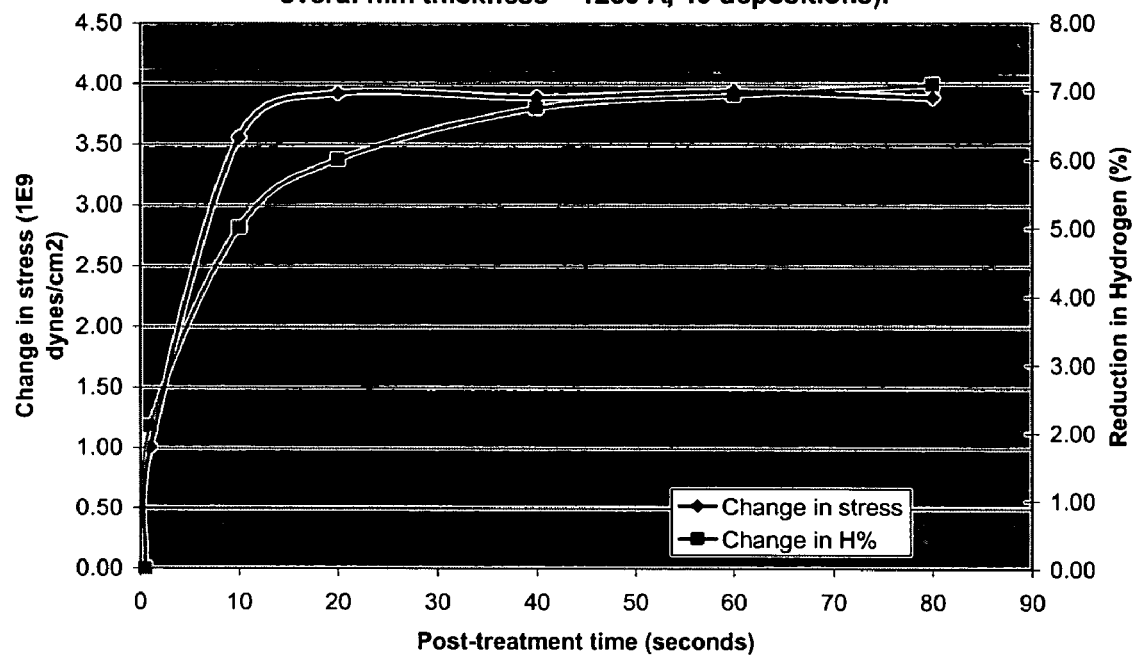
FIG. 1 is a plot of the change in tensile stress and hydrogen concentration is plotted as a function of the post-deposition plasma anneal treatment time.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

The present invention relates to an improved strained transistor architecture and fabrication technique. The architecture has been developed for 90 nm logic technology on 300 mm wafers, although it is not so limited in application. Transistor strain is generated is NMOS devices using a highly tensile post-salicide silicon nitride capping layer on the source and drain regions. The stress from this capping layer is uniaxially transferred to the NMOS channel through the source-drain regions to create tensile strain in NMOS channel. A 1000 Å nitride capping layer with a stress of 1E10 dynes/cm² has been shown to provide a 10% NMOS $I_{DSAT}$ gain from tensile channel strain (Ghani, et al., A 90 nm High Volume Manufacturing Logic Technology Featuring Novel 45 nm Gate Length Strained Silicon CMOS Transistors, IEEE (2003), incorporated by reference herein in its entirety for all purposes).

While the invention is not limited by this theory, it is generally accepted that irreversible tensile stress develops in PECVD films from the reduction of the amount of hydrogen in the film, and due to shrinkage of voids. The loss of hydrogen results in a volume change in the film, but the constraint of the substrate prevents any lateral shrinkage, thus imposing tensile strains in the film. Anneal tests, for example at 425° C. for 2 hours in a $N_2$ atmosphere, indicate that it is possible to increase the tensile stress of SiN films if they are provided sufficient energy to attain the right bonding configuration and stoichiometry, in particular the removal of H and formation of extended Si—N bonds. The change in hydrogen concentration has been shown to be proportional to the irreversible stress change, and higher temperatures are known best to remove the hydrogen in the film.

It is possible to use a furnace to anneal the wafers at a higher temperature to attain a higher tensile stress. However, there are substantial thermal budget constraints. A conventional anneal temperature of about 600° C. degrades the salicide underlying the capping layer, increasing its resistivity beyond the level at deposition and possibly to unacceptable levels. A lower temperature anneal may be used, for example, one in which the anneal temperature does not exceed 425° C. However, the duration of an anneal process at that temperature that is necessary to obtain the benefit (e.g., 2 hours) is not economically viable.

Post-Salicide PECVD SiN with Post-Deposition Plasma Treatment

Accordingly, a post-salicide processing technique for increasing SiN capping layer stress without thermally degrading the salicide has been developed. The technique involves a PECVD silicon nitride film.

Conventionally, PECVD silicon nitride films have employed low frequency RF (LFRF), in addition to high frequency RF (HFRF), during plasma processing, resulting in compressive films. Without the LF power, a tensile film may be formed. For example, a PECVD SiN film with a substantially uniform tensile stress of as high as about 8.4E9 dynes/cm² may be deposited at about 425° C. However, a tensile stress in excess of 1E10 dynes/cm² is necessary for optimal results.

In order to address this issue, it is necessary to provide sufficient energy to the deposited film quickly and without going to higher temperatures. The present invention uses the plasma itself as the source of this energy. Post-deposition plasma treatment at temperatures not exceeding 425° C. has been found to substantially increase film tensile stress. For example, a one-minute 800–1500 W HFRF plasma treatment in $N_2$ and $NH_3$, after depositing a 300 Å layer of SiN, has been found to increase tensile stress by about 0.2–0.3 E9 dynes/cm². This change in stress is quite small, but, as described in further detail below, it has been found that the stress increase in this manner is dependent upon the thickness of the film deposited before the post-treatment is done. For example, a 20s post-treatment on a 30 Å film (this process is repeated until the desired film thickness is achieved) has been found to increase the film stress from 8 E9 to 1.2 E10 dynes/cm². Again, while not limiting of the invention, it is hypothesized that the presence of NH species in the plasma helps remove H from the surface of a deposited film. The region where these changes occur is referred to as the "condensation zone." For a very thin layer of film, this zone can be assumed to be the entire film. For thicker films, the "condensation zone" is the few atomic layers on the top; the rest of the film does not undergo any of these changes. The removal of H creates dangling Si and N bonds leading to the formation of stretched Si—N bonds. Once this is done, the next layer of film deposited constrains the layer below, not allowing it to relax, thus ensuring a high film stress.

Thus, in accordance with the present invention, the SiN capping layer is deposited in a PECVD process and subjected to a post-deposition plasma anneal in the PECVD reactor for up to about a minute. Referring to FIG. 1, the change in tensile stress and hydrogen concentration is plotted as a function of the post-deposition plasma anneal treatment time. The effect of the post-deposition plasma anneal treatment on the reduction in the hydrogen content of a film about 30 Å thick, and the corresponding tensile stress increase is shown. It has been found that a post-deposition plasma anneal treatment of about 20 seconds provides a high tensile stress, and anything longer does not increase the stress to any significant extent. Increase in tensile stress is shown to be proportional to the reduction in hydrogen concentration. The apparent rate constant of the process decreases with increasing post-treatment time. Accordingly, in a preferred embodiment, the post-deposition plasma anneal has a duration of about 20s.

Figure 2:
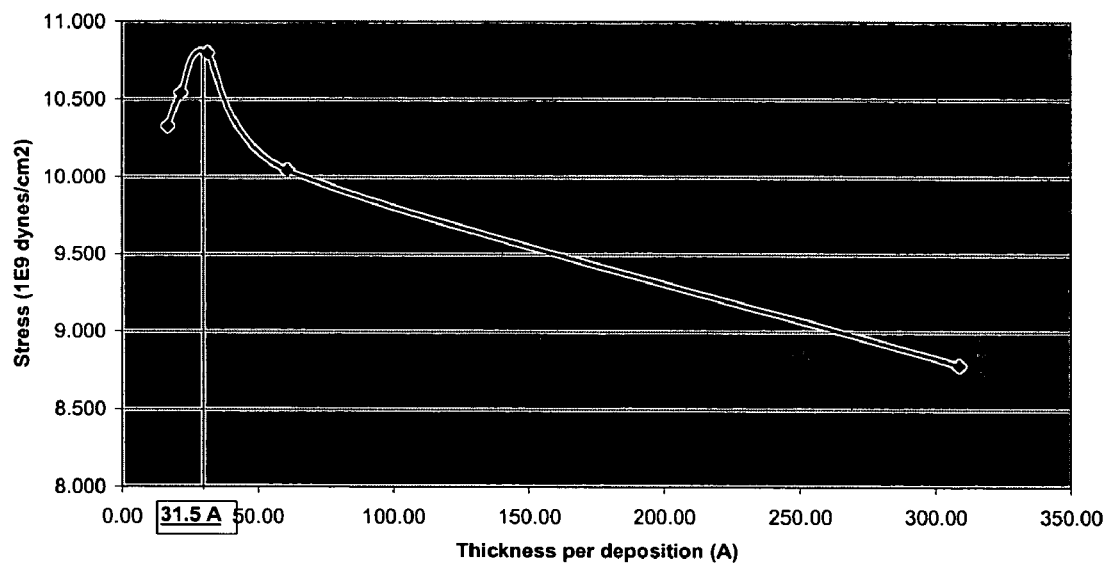
FIG. 2 is a plot of overall tensile stress of a SiN capping layer is plotted as a function of the thickness of the deposited layers that form the film.

Further, as indicated above, the thickness of the deposited film is an important factor in the effectiveness and efficiency of the post-deposition plasma anneal treatment. Referring to FIG. 2, overall tensile stress of a SiN capping layer is plotted as a function of the thickness of the deposited layers that form the film. The effect of the thickness of each deposited layer on overall film stress is shown. It has been found that a film of about 30 Å thick is optimal. Thinner films relax following plasma treatment, thus lowering the stress. A higher film thickness reduces the chances of H removal and bond rearrangement in the portion of the deposited film that is farther from the surface, thereby not maximizing the stress.

Accordingly, in a preferred embodiment of the invention, the SiN capping layer is deposited in a series of thin (e.g., about 20 to 40 Å, e.g., 30 Å) film layers that are subjected to the post-deposition plasma anneal treatment for up to about a minute, for example about 10 to 40 seconds (e.g., 20s). The deposition and anneal treatments are repeated until the total film thickness is achieved. Accordingly up to 40 or more (e.g., 10, 25 or 40) depositions may be used. Total film thickness for the SiN capping layer may be about 100 to 1500 Å, for example 1250 Å.

The post-deposition plasma anneal treatment may use the same conditions as the deposition, but with the $SiH_4$ or other silicon precursor flow shut off, thus providing a $N_2+NH_3$ only plasma. This considerably reduces the processing time compared to cases where the plasma conditions need to be set again. Alternatively, if the optimization of the post-deposition plasma results in plasma conditions different from the conditions used in deposition, for example, then these may be set separately.

Table 1, below, provides suitable deposition conditions for a SiN capping layer in accordance with the present invention:

TABLE 1

| Parameter | Range |
| --- | --- |
| SiH4 (sccm) | 100–200 |
| NH3 (sccm) | 1000–2500 |
| N2 (sccm) | 5000–10000 |
| HFRF (W) | 500–700 |
| Pressure (Torr) | 6–8 |
| Temperature (° C.) | 250 ≦ X ≦ 425 |

As noted above, the post-deposition plasma anneal treatment may use the same conditions as the deposition, but with the $SiH_4$ or other silicon precursor flow shut off, to enhance efficiency/throughput. Alternatively, plasma conditions different from the conditions used in deposition may be used, for example as provided in Table 2, below.

TABLE 2

| Parameter | Range |
| --- | --- |
| NH3 (sccm) | 0 |
| N2 (sccm) | 4000–8000 |
| HFRF (W) | 400–600 |
| Pressure (Torr) | 4.5–5.5 |
| Temperature (° C.) | ≦425 (the higher the better) |

Figure 3:
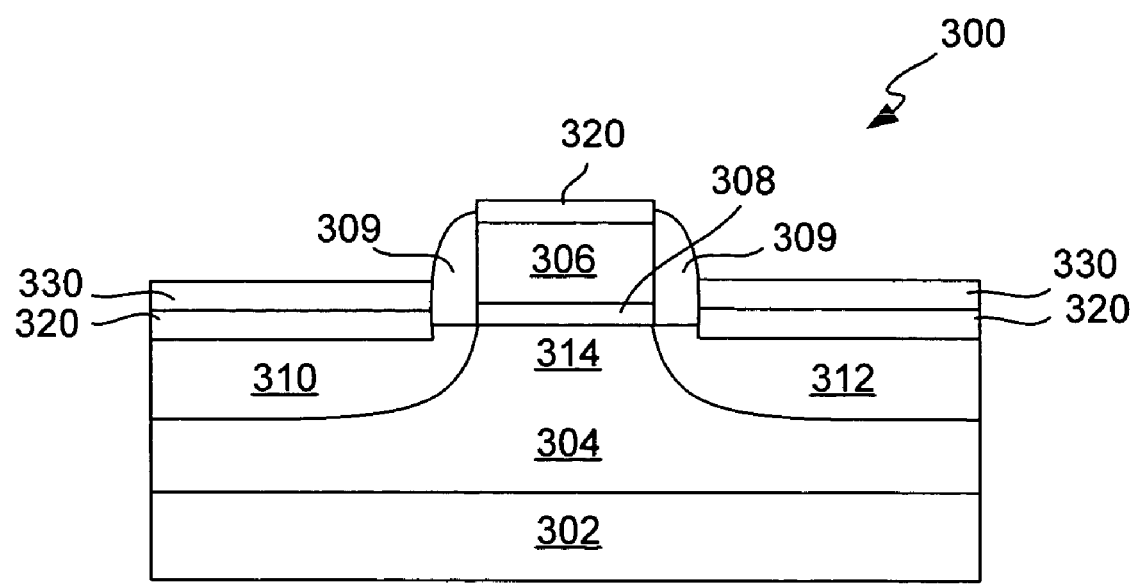
FIG. 3 depicts a simple transistor architecture in accordance with an embodiment of the present invention.

FIG. 3 illustrates a simple transistor architecture in accordance with a preferred embodiment of the present invention. The transistor 300 typically has a NMOS transistor structure composed of a p-doped substrate 302, an n-doped well 304 within the substrate 302, a conductive gate 306 separated from the n-well 304 of the substrate 302 by a gate dielectric 308 and p-doped source 310 and drain 312 regions in the well 304 on either side of the gate 306, and a channel 314 region underlying the gate 306. There may also be sidewall spacers 309 on the gate 306. The source 310 and drain 312 regions and the gate 306 are covered with a layer of self-aligned silicide (salicide) 320, and the salicide is covered with a SiN capping layer 330. The channel 314 region is strained by tensile stress in the capping layer 330 transferred to the channel 314 region via the source 310 and drain 312 regions, and the salicide 320 resistivity is substantially as on formation. The SiN capping layer 330 is formed on the salicide 320 by a technique that does not require a temperature of greater than 425° C. such that the salicide 320 is not thermally degraded by the application of the capping layer 330. As a result, the resistivity of the salicide 320 in the final transistor 300 remains substantially as on deposition.

Figure 4:
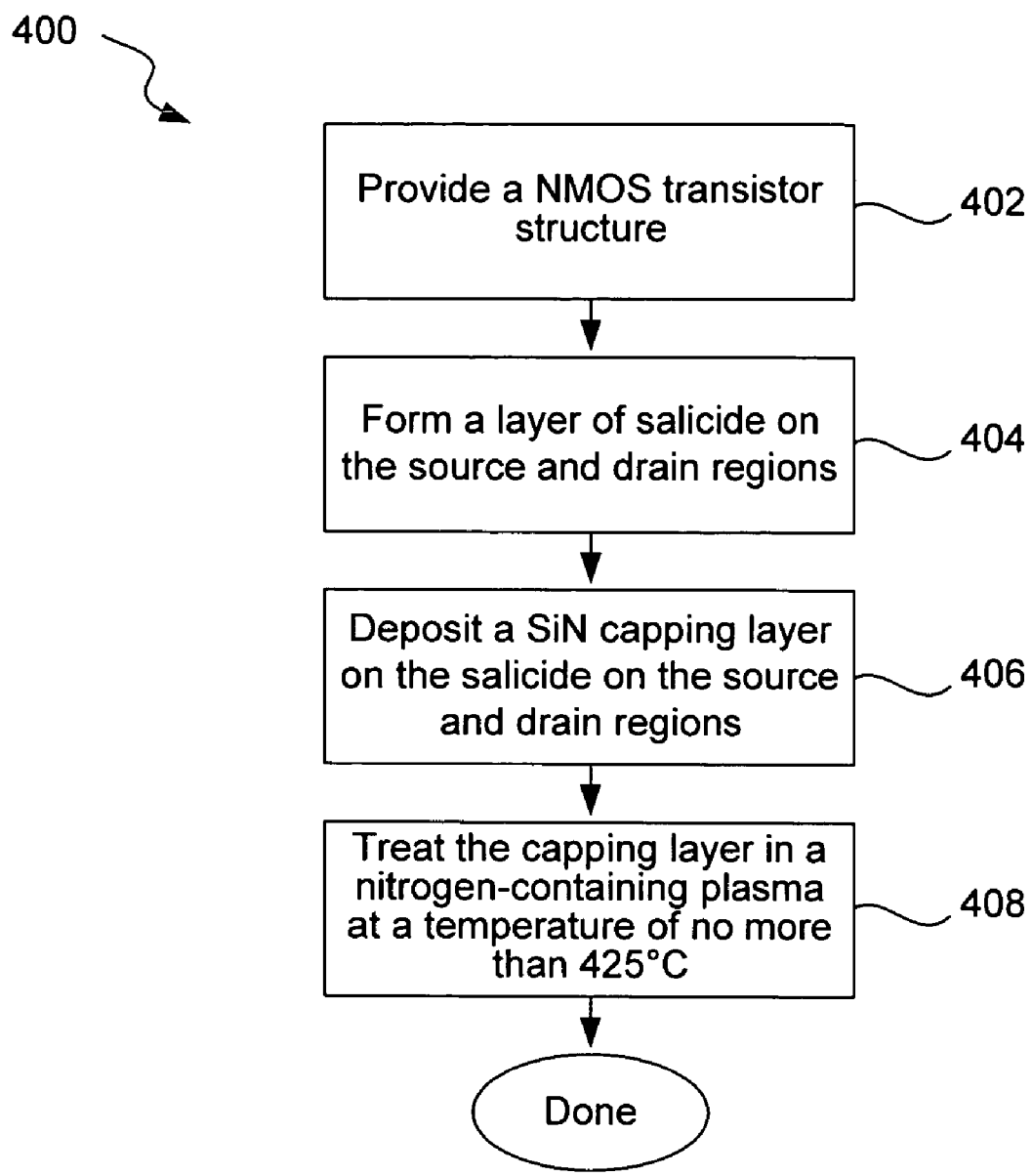
FIG. 4 depicts important stages in a process flow for a method of fabricating a strained transistor structure in accordance with an embodiment of the present invention.

FIG. 4 depicts important stages in a process flow for a method of fabricating a strained transistor structure in accordance with an embodiment of the present invention. The method 400 involves providing a NMOS transistor structure (402), the NMOS transistor structure having a substrate, a conductive gate separated from the substrate by a gate dielectric, source and drain regions in the well on either side of the gate, and a channel region underlying the gate. A layer of salicide is formed on the source and drain regions (404). A highly tensile SiN capping layer is then formed on the salicide overlying the source and drain regions. The SiN capping layer is formed by depositing a SiN layer on the salicide of the source and drain regions (406), and treating the capping layer in a nitrogen-containing plasma at a temperature of no more than 425° C. (408). Hydrogen is removed from the capping layer thereby inducing tensile stress in the capping layer that is transferred to the NMOS channel through the source and drain regions resulting in a strained channel.

As noted above, the deposition and treatment processes are preferably conducted using a PECVD process in which the SiN capping layer is deposited in a series of thin (e.g., 30 Å) film layers that are subjected to the post-deposition plasma anneal treatment for about 20s, for example. The deposition and anneal treatments are repeated until the total film thickness is achieved. Accordingly, up to 40 or more depositions may be used for a total film thickness of, for example, 1250 Å. Of course, fewer depositions and plasma treatments may be used for thinner films, e.g., 10 30 Å depositions/treatments for a 300 Å film or 25 30 Å depositions/treatments for a 700 Å film.

The post-deposition plasma anneal treatment may use the same conditions as the deposition, but with the $SiH_4$ or other silicon precursor flow shut off, thus providing a $N_2+NH_3$ only plasma. This considerably reduces the processing time compared to cases where the plasma conditions need to be set again. Alternatively, different conditions may be set separately.

Apparatus

The present invention is preferably implemented in a plasma enhanced chemical vapor deposition (PECVD) reactor. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing SiN capping layer deposition and treatment is transferred from one station to another within the reactor during the process. While in process, each wafer is held in place by a pedestal, wafer chuck and/or other wafer holding apparatus. For certain operations in which the wafer is to be heated, the apparatus may include a heater such as a heating plate. In a preferred embodiment of the invention, a Vector™ or Sequel™ reactor, produced by Novellus Systems of San Jose, Calif., may be used to implement the invention.

Figure 5:
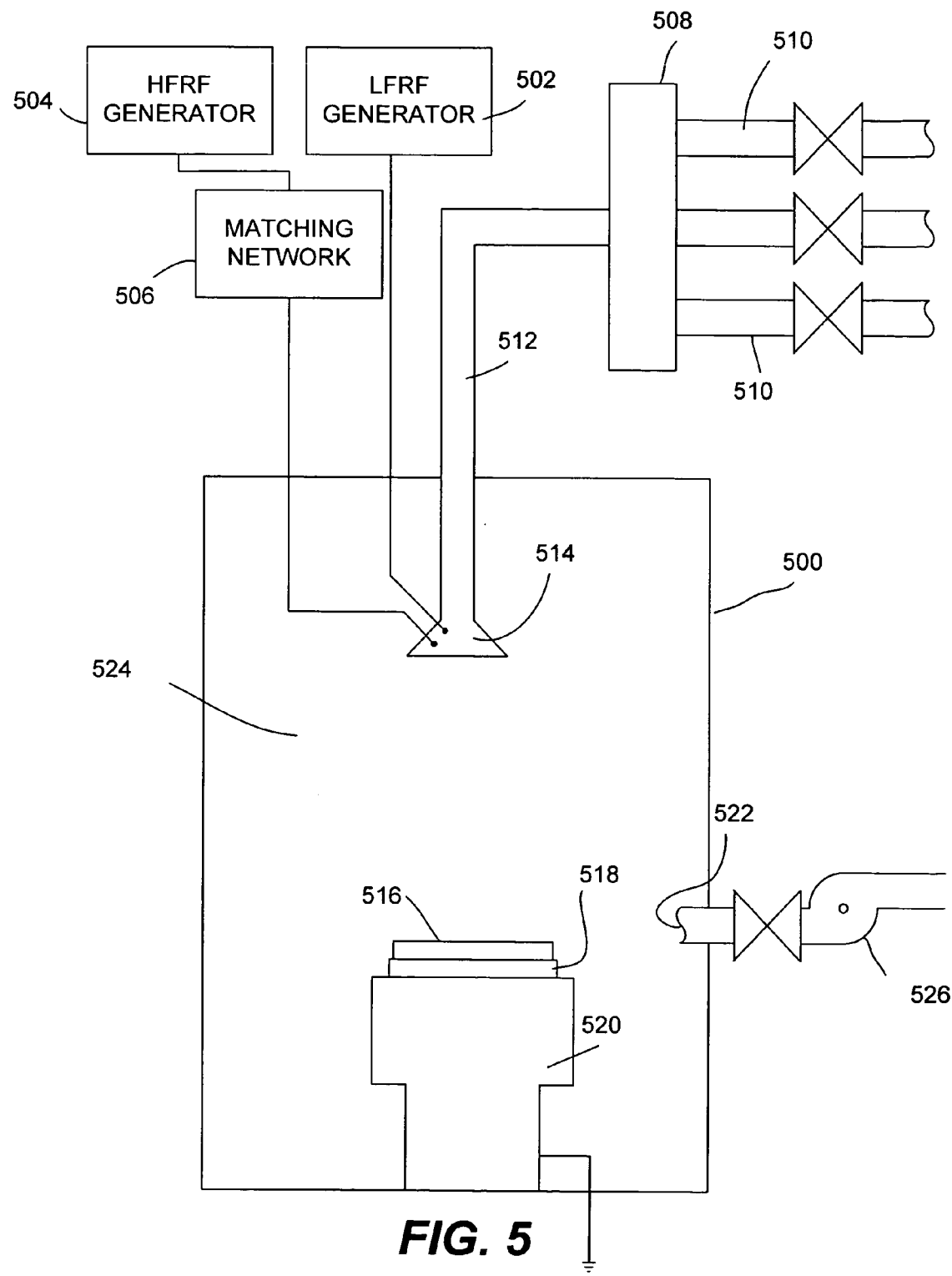
FIG. 5 is a simple block diagram depicting various reactor components arranged for implementing the present invention.

FIG. 5 provides a simple block diagram depicting various reactor components arranged for implementing the present invention. As shown, a reactor 500 includes a process chamber 524, which encloses other components of the reactor and serves to contain the plasma generated by a capacitor type system including a showerhead 514 working in conjunction with a grounded heater block 520. A high-frequency RF generator 502, connected to a matching network 506, and a low-frequency RF generator 504 are connected to showerhead 514. The power and frequency supplied by matching network 506 is sufficient to generate a plasma from the process gas, for example 400–700 W total energy. In the implementation of the present invention only the HFRF generator is used. In a typical process, the high frequency RF component is generally between 2–60 MHz; in a preferred embodiment, the HF component is 13.56 MHz.

Within the reactor, a wafer pedestal 518 supports a substrate 516. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 512. Multiple source gas lines 510 are connected to manifold 508. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 500 via an outlet 522. A vacuum pump 526 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

The invention may be implemented on a multi-station or single station tool. In specific embodiments, the 300 mm Novellus Vector™ tool having a 4-station deposition scheme or the 200 mm Sequel™ tool having a 6-station deposition scheme are used. It is possible to index the wafers after every deposition and/or post-deposition plasma anneal treatment until all the required depositions and treatments are completed, or multiple depositions and treatments can be conducted at a single station before indexing the wafer. It has been shown that film stress is the same in either case. However, conducting multiple depositions/treatments on one station is substantially faster than indexing following each deposition and/or treatment.

EXAMPLE

The following example is provided to further illustrate aspects and advantages of the present invention. This example is provided to exemplify and more clearly illustrate aspects of the present invention and is in no way intended to be limiting.

A SiN capping layer film was deposited over 10, 25 or 40 depositions (Station Deposition Time (SDT) reduced accordingly to get the same overall film thickness of 1250 Å), rather than the conventional 4 depositions. Each deposition was followed by a plasma anneal treatment using the same flows of $N_2$ and $NH_3$ and the same HF power as in the deposition process, but shutting off the $SiH_4$ flow. The 40-deposition process, with a post-treatment of 20s after every deposition was found to increase the stress from 8 E9 to 1.20 E10 dynes/$cm^2$, while the 10 and 25 deposition processes with the same 20s post-treatment after every deposition provided stresses of 9.2 E9 and 10.5 E9 dynes/$cm^2$, respectively. This experiment demonstrates that reducing the thickness of the film deposited per layer increases the overall film stress even with the same post-treatment time.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. Accordingly, the present embodiments are to be considered as illustrative and not restrictive, and the invention is not to be limited to the details given herein.

All references cited herein are incorporated by reference for all purposes.

What is claimed is:

1. A method of fabricating a transistor, comprising:
    providing a NMOS transistor structure comprising a substrate, a conductive gate separated from the substrate by a gate dielectric, source and drain regions in the substrate on either side of the gate, and a channel region underlying the gate;
    forming a layer of salicide on the source and drain regions;
    depositing a SiN capping layer on the salicide of the source and drain regions; and
    subjecting the SiN capping layer to a post-deposition treatment in a nitrogen-containing plasma at a temperature of no more than 425° C.;
    whereby hydrogen is removed from the SiN capping layer thereby inducing tensile stress in the SiN capping layer that is transferred to the channel region through the source and drain regions resulting in a strained channel.

2. The method of claim 1, wherein the SiN film is deposited and treated using a PECVD process.

3. The method of claim 2, wherein the deposition and treatment of the SiN capping layer comprise:
   (a) depositing a portion of the total thickness of the SiN capping layer;
   (b) treating the portion of the SiN capping layer;
   (c) repeating (a) and (b) until the total thickness of the SiN capping layer is achieved.

4. The method of claim 3, wherein the portion of the SiN capping layer is about 10 to 40 Å thick.

5. The method of claim 4, wherein the portion of the SiN capping layer is about 30 Å thick.

6. The method of claim 3, wherein the post-deposition plasma treatment has a duration of no more than 1 minute.

7. The method of claim 6, wherein the post-deposition plasma treatment has a duration of about 10 to 40 seconds.

8. The method of claim 7, wherein the post-deposition plasma treatment has a duration of about 20 seconds.

9. The method of claim 3, wherein the portion of the SiN capping layer is about 30 Å thick and the duration of the post-deposition plasma treatment is about 20 seconds.

10. The method of claim 3, wherein the deposition conditions for the SiN capping layer are defined within the following ranges:

| Parameter | Range |
|---|---|
| SiH4 (sccm) | 100–200 |
| NH3 (sccm) | 1000–2500 |
| N2 (sccm) | 5000–10000 |
| HFRF (W) | 500–700 |
| Pressure (Torr) | 6–8 |
| Temperature (° C.) | $250 \leq X \leq 425$. |

11. The method of claim 10, wherein the post-deposition plasma treatment conditions for the SiN capping layer are defined within the following ranges:

| Parameter | Range |
|---|---|
| SiH4 (sccm) | 0 |
| NH3 (sccm) | 1000–2500 |
| N2 (sccm) | 5000–10000 |
| HFRF (W) | 500–700 |
| Pressure (Torr) | 6–8 |
| Temperature (° C.) | $250 \leq X \leq 425$. |

12. The method of claim 10, wherein the post-deposition plasma treatment conditions for the SiN capping layer are defined within the following ranges:

| Parameter | Range |
|---|---|
| NH3 (sccm) | 0 |
| N2 (sccm) | 4000–8000 |
| HFRF (W) | 400–600 |
| Pressure (Torr) | 4.5–5.5 |
| Temperature (° C.) | $\leq 425$. |

13. The method of claim 3, wherein the total thickness of the SiN capping layer is between about 100 and 1500 Å.

14. The method of claim 13, wherein the total thickness of the SiN capping layer is about 1250 Å.

15. The method of claim 14, wherein (a) and (b) are repeated about 40 times.

16. The method of claim 1, wherein the tensile stress of the SiN capping layer is in excess of 1E10 dynes/m$^2$.

17. A method of fabricating a highly tensile SiN layer on a heat sensitive substrate, comprising:
   providing a heat sensitive substrate having a silicide surface layer;
   depositing a SiN capping layer on the silicide layer; and
   subjecting the SiN capping layer to a post-deposition treatment in a nitrogen-containing plasma at a temperature of no more than 425° C.;
   whereby hydrogen is removed from the SiN capping layer thereby inducing tensile stress in the SiN capping layer.

* * * * *

UNITED STATES PATENT AND TRADEMARK OFFICE
CERTIFICATE OF CORRECTION

| | | |
|---|---|---|
| PATENT NO. | : 7,041,543 B1 | Page 1 of 1 |
| APPLICATION NO. | : 10/923259 | |
| DATED | : May 9, 2006 | |
| INVENTOR(S) | : Varadarajan et al. | |

It is certified that error appears in the above-identified patent and that said Letters Patent is hereby corrected as shown below:

Column 10:

line 32, of claim 16, change "dynes/m2" to --dynes/cm2--.

Signed and Sealed this

Twenty-ninth Day of July, 2008

JON W. DUDAS
*Director of the United States Patent and Trademark Office*